(12) United States Patent
Yamada (10) Patent No.: US 8,754,475 B2
(45) Date of Patent: Jun. 17, 2014

(54) SEMICONDUCTOR DEVICE AND METHOD OF MANUFACTURING THE SAME

(75) Inventor: Masaki Yamada, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/236,570

(22) Filed: Sep. 19, 2011

(65) Prior Publication Data

US 2012/0261749 A1 Oct. 18, 2012

(30) Foreign Application Priority Data

Apr. 15, 2011 (JP) ................... 2011-90988

(51) Int. Cl.
*H01L 29/66* (2006.01)
*H01L 21/336* (2006.01)

(52) U.S. Cl.
USPC .......................................... 257/335; 438/270

(58) Field of Classification Search
None
See application file for complete search history.

(56) References Cited

U.S. PATENT DOCUMENTS

| | | | |
|---|---|---|---|
| 6,617,205 B1 | 9/2003 | Kimura et al. | |
| 7,071,099 B1 | 7/2006 | Greco et al. | |
| 7,642,653 B2 | 1/2010 | Kuzuhara et al. | |
| 2004/0192008 A1 | 9/2004 | Matsunuma | |
| 2008/0261398 A1* | 10/2008 | Sakata et al. | 438/680 |
| 2010/0130003 A1* | 5/2010 | Lin et al. | 438/637 |
| 2010/0130004 A1* | 5/2010 | Watanabe et al. | 438/637 |
| 2011/0073955 A1* | 3/2011 | Pendharkar et al. | 257/378 |
| 2011/0111560 A1* | 5/2011 | Purushothaman et al. | 438/109 |
| 2011/0266691 A1* | 11/2011 | Lin et al. | 257/774 |
| 2012/0261798 A1* | 10/2012 | Inoue | 257/532 |

FOREIGN PATENT DOCUMENTS

| | | |
|---|---|---|
| JP | 2004253555 A | 9/2004 |
| JP | 2006-114723 | 4/2006 |
| JP | 2008-171878 | 7/2008 |
| JP | 2008541462 A | 11/2008 |
| WO | 9719468 A1 | 5/1997 |

OTHER PUBLICATIONS

Japanese Office Action dated Apr. 8, 2014, filed in Japanese counterpart Application No. 2011-090988, 6 pages (with translation).

* cited by examiner

*Primary Examiner* — Mark Tornow
*Assistant Examiner* — Priya Rampersaud
(74) *Attorney, Agent, or Firm* — Patterson & Sheridan, LLP (57) ABSTRACT

The semiconductor device according to one embodiment of the present invention includes: a semiconductor substrate; and a first area and a second area which are respectively provided on the semiconductor substrate. The first area includes: a first metal wiring formed in a first wiring layer above the semiconductor substrate and having a certain first width; a second metal wiring formed in a second wiring layer located in an upper layer of the first wiring layer and having the first width; and a first contact connecting the first metal wiring and the second metal wiring and having a second width equal to or less than the first width. The second area includes a third metal wiring having a film thickness from the first wiring layer to the second wiring layer and having a certain third width.

14 Claims, 10 Drawing Sheets

SEMICONDUCTOR DEVICE AND METHOD OF MANUFACTURING THE SAME

CROSS REFERENCE TO RELATED APPLICATION

This application is based upon and claims the benefit of priority from prior Japanese Patent Application No. 2011-90988, filed on Apr. 15, 2011, the entire contents of which are incorporated herein by reference.

BACKGROUND

1. Field

Embodiments described herein generally relate to a semiconductor device and a method of manufacturing the same.

2. Description of the Related Art

As one of power semiconductor devices, a so-called DMOS transistor is known. The DMOS transistor has a drift region which is adjacent to a drain diffusion layer having a high impurity concentration, and which is of the same conductive type as this drain diffusion layer and has a lower impurity concentration than the drain diffusion layer. The DMOS transistor has characteristics that a switching speed is high and conversion efficiency is high in a comparatively low voltage area, and can achieve both of a high breakdown voltage operation and low on-resistance.

The high breakdown voltage of the DMOS transistor is realized by optimally designing a depletion layer, and the low on-resistance is realized by optimizing a cell resistance of a unit element. However, the high breakdown voltage and low on-resistance have a trade-off relationship, and an optimal structure for the high breakdown voltage and an element structure for obtaining the low on-resistance need to be optimized. While resistance components of the DMOS transistor include, for example, a diffusion layer resistance, channel resistance, drift layer resistance and wiring resistance, the wiring resistance is a resistance component which is little influenced by an element design on the semiconductor substrate. It is necessary to reduce the wiring resistance to have the low on-resistance without decreasing the breakdown voltage.

DETAILED DESCRIPTION

The semiconductor device according to one embodiment of the present invention includes: a semiconductor substrate; and a first area and a second area which are respectively provided on the semiconductor substrate. The first area includes: a first metal wiring formed in a first wiring layer above the semiconductor substrate and having a certain first width; a second metal wiring formed in a second wiring layer located in an upper layer of the first wiring layer and having the first width; and a first contact connecting the first metal wiring and the second metal wiring and having a second width equal to or less than the first width. The second area includes a third metal wiring having a film thickness from the first wiring layer to the second wiring layer and having a certain third width.

Next, a semiconductor device according to embodiments will be described with reference to the drawings.

First Embodiment

Configuration of Semiconductor Device

First, a stacked structure of a semiconductor device according to a comparative example will be described with reference to FIG. 1. Then, a structure of a semiconductor device according to the first embodiment will be described with reference to FIG. 2.

Figure 1:
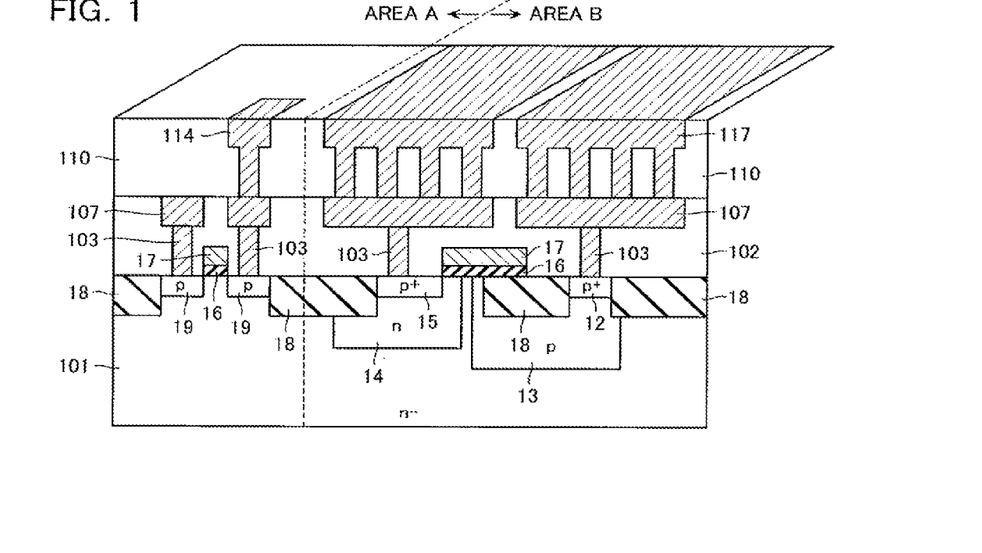
FIG. 1 is a perspective view illustrating a configuration of a semiconductor device.

FIG. 1 is a sectional view illustrating a configuration of a semiconductor device according to a comparative example. In the following description, "p– type" refers to a semiconductor having a lower impurity concentration than "p type". Further, "n– type" refers to a semiconductor having a lower impurity concentration than "n type". Furthermore, "p+ type" refers to a semiconductor having a higher impurity concentration than "p type".

As illustrated in FIG. 1, a semiconductor device is formed on, for example, an n– type semiconductor substrate 101. The semiconductor substrate 101 has an area A (a first area) and an area B. In the area A, an element used for a logic circuit or the like is formed (a PMOS transistor is formed in the example illustrated in FIG. 1). In the example illustrated in FIG. 1, the area B is an area in which a p channel type DMOS transistor is formed. The PMOS and DMOS transistors are just one example of elements formed in the semiconductor device, and the conductive types of various conductive layers in FIG. 1 may all be inversed to constitute n channel type transistors. Further, an element formed in each area is not limited to a MOS transistor. The element formed in each area is not limited to specific types, but includes a bipolar transistor, diode, resistive element, and the like. Further, the element formed in the area B only needs to be an element which needs to reduce a wiring resistance.

As illustrated in FIG. 1, gate electrodes 17 are formed on the semiconductor substrate 101 via gate insulation films 16. The gate electrodes 17 are provided, for example, not only in the area A but also in the area B.

First, the structure of the DMOS transistor in the area B will be described. The gate electrode 17 in the area B is positioned between a p+ type drain region 12 which functions as a drain of a p channel type DMOS transistor, and a p+ type source region 15 which functions as a source of the same p channel type DMOS transistor. In the lower layer of the drain region 12, a p type diffusion region 13 is formed. Further, as illustrated in FIG. 1, in the lower layer of the source region 15, an n type diffusion region 14 is formed.

Further, silicon oxide films 18 (for example, SiO$_2$ film) are formed on the surface of the semiconductor substrate 101. The silicon oxide films 18 function as field oxide films. The silicon oxide films 18 may be removed depending on the breakdown voltage of a desired MOS transistor. The sizes, impurity concentrations and so on of the drain region 12, p type diffusion region 13, n type diffusion region 14 and source region 15 are set to satisfy desired characteristics such as an on-resistance and breakdown voltage of the p channel type DMOS transistor in the element area.

Next, the structure of the PMOS transistor in the area A will be described. The gate electrode 17 in the area A is positioned between p type diffusion regions 19 which function as a drain or source of the PMOS transistor. The silicon oxide films 18 in the area A function as element separation insulation films.

The semiconductor device according to the comparative example illustrated in FIG. 1 is buried by an interlayer insulation film 102 and an interlayer insulation film 110. Note that, a stopper film or the like is provided between the interlayer insulation film 102 and the interlayer insulation film 110, like in a manufacturing method of the semiconductor device of the first embodiment described later, although not illustrated in FIG. 1. Columnar contacts 103 are formed in the interlayer insulation film 102 to penetrate the interlayer insulation film 102 and connect to the p type diffusion regions 19 in the area A, and the drain region 12 and the source region 15 in the area B, respectively. Further, a metal layer 107 is provided to connect to upper parts of the contacts 103 in the interlayer insulation film 102.

A metal layer 114 is formed in the interlayer insulation film 110 in the area A to penetrate the interlayer insulation film 110 and connect to the metal layer 107. Further, a metal layer 117 is formed in the interlayer insulation film 110 in the area B to penetrate the interlayer insulation film 110 and connect to the metal layers 107. In the areas A and B, the metal layers 107 and metal layers 114 and 117 function as wirings. In the semiconductor device according to the comparative example illustrated in FIG. 1, the metal layers 117 in the area B are configured to be connected to the metal layers 107 in the lower layer through a plurality of columnar contacts.

However, the wirings of the DMOS transistor formed in the area B illustrated in FIG. 1 are subject to limitation such as a wiring width determined by the pitch between the source and drain. Therefore, it is not possible to simply widen the wiring width to achieve a low resistance of the wirings. Further, connecting the metal layers through the contacts is also restricted by burying capability of a metal material used for the wirings. Therefore, the wiring structure according to the comparative example illustrated in FIG. 1 has difficulty in reducing the wiring resistance.

Semiconductor Device According to First Embodiment

From this viewpoint, the following configuration is employed in the first embodiment. Hereinafter, the configuration of the semiconductor device according to the present embodiment will be described with reference to FIG. 2.

Figure 2:
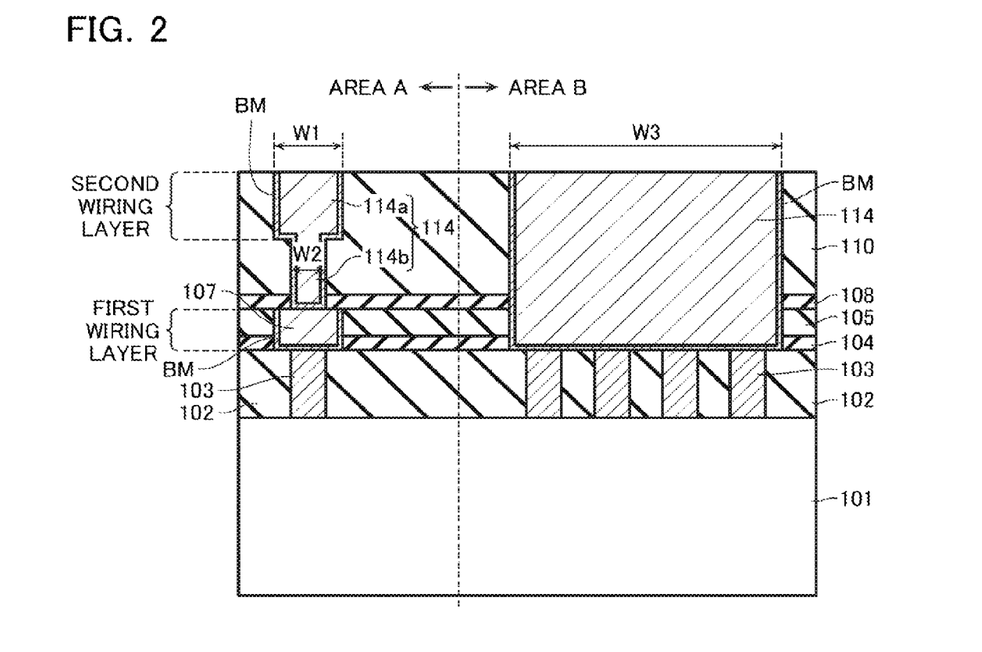
FIG. 2 is a sectional view illustrating a configuration of a semiconductor device according to a first embodiment.

FIG. 2 is a sectional view illustrating a configuration of a semiconductor device according to the first embodiment. The entire configuration of the semiconductor device according to the present embodiment is the same as that of the comparative example illustrated in FIG. 1. Further, portions employing the same configurations as in the comparative example will be assigned the same reference numerals, and duplicate description thereof will be omitted. FIG. 2 illustrates a configuration of the semiconductor device above the interlayer insulation film 102 stacked on the semiconductor substrate 101, and does not illustrate impurity diffusion layers (12, 13, 14, and 15) formed on the semiconductor substrate 101. The semiconductor device according to the present embodiment illustrated in FIG. 2 differs from the semiconductor device according to the comparative example in that the wiring connected to the contacts 103 in the area B is formed as one thick metal layer.

As illustrated in FIG. 2, in the area A of the semiconductor device according to the present embodiment, the metal layers 107 including barrier metal BM are provided to connect to the contact 103. The metal layer 107 is provided to penetrate a stopper film 104 and a interlayer insulation film 105 provided on the interlayer insulation film 102. A layer in which this metal layer 107 is formed is referred to as a first wiring layer. A stopper film 108 and an interlayer insulation film 110 are provided on this metal layer 107. The stopper film 104 and the stopper film 108 function as stoppers for etching in the method of manufacturing a semiconductor device which will be described later. Additionally, the stopper film 108 has a function of preventing diffusion of metal (for example, copper) used for the metal layer 107 into an interlayer insulation film 110.

Further, in the area A, a metal layer 114 including barrier metal BM is formed to penetrate the interlayer insulation film 110 and the stopper film 108 and connect to the metal layer 107. The metal layer 114 is formed using a damascene method as method of manufacturing a semiconductor device described later. In this case, an upper part 114a of the metal layer 114 serves as a wiring portion, and a lower part 114b of the metal layer 114 serves as a columnar contact portion. That is, a layer in which the metal layer 114a is formed is referred to as a second wiring layer. In the area A, the metal layer 107 and the metal layer 114a (wiring portion) have a certain width W1, and the metal layer 114b (contact portion) has a width W2 equal to or less than the width W1. Miniaturization of the area A in which the logic circuit is formed is demanded, and the widths W1 and W2 are defined according to the minimum feature size in the manufacturing process.

In the semiconductor device according to the present embodiment, the metal layer 114 including barrier metal BM is provided in the area B to penetrate the interlayer insulation films 110 and 105 and the stopper films 108 and 104 and connect to the contacts 103. In the semiconductor device according to the comparative example illustrated in FIG. 1, the number of contacts 103 connected to each of the drain region 12 and the source region 15 is just one. However, as illustrated in FIG. 2, a plurality of contacts 103 may be provided to each of the drain region 12 and the source region 15, respectively. The metal layer 114 in the area B is formed to have a thickness from the second wiring layer (layer in which the metal layer 114a is formed in the area A) to the first wiring layer (layer in which the metal layer 107 is formed). Further, the metal layer 114 is formed in the area B to have a width W3 wider than the width W1.

[Advantage]

In the semiconductor device according to the present embodiment, the metal layer 114 is formed in the area B to have a film thickness over two wiring layers. Although, in the comparative example illustrated in FIG. 1, there is the interlayer insulation film 110 between the metal layers 107 and the metal layers 117, the semiconductor device according to the present embodiment illustrated in FIG. 2 does not include the interlayer insulation film in the metal layer 114. In the semiconductor device according to the present embodiment, the area in which the interlayer insulation film 110 is provided is replaced by the metal layer 114 and, consequently, the sectional area of the wiring increases, so that it is possible to reduce the wiring resistance. Further, by making the wiring width W3 of the metal layer 114 in the area B wider than the wiring width W1 in the area A, the sectional area of the wiring further increases and, consequently, it is possible to reduce the wiring resistance. Also, even when the thickness of the wirings becomes thicker, it is possible to form a metal layer which can be well-buried.

Next, a method of manufacturing a semiconductor device according to the present embodiment will be described with reference to FIGS. 3 to 14. FIGS. 3 to 14 are sectional views illustrating the method of manufacturing a semiconductor device according to the first embodiment. Note that, in the method of manufacturing a semiconductor device, a forming process of a semiconductor device such as a DMOS transistor is performed by a common method of manufacturing a semiconductor device. Hereinafter, a method of manufacturing wiring layers formed above the contacts 103 will be described.

Figure 3:
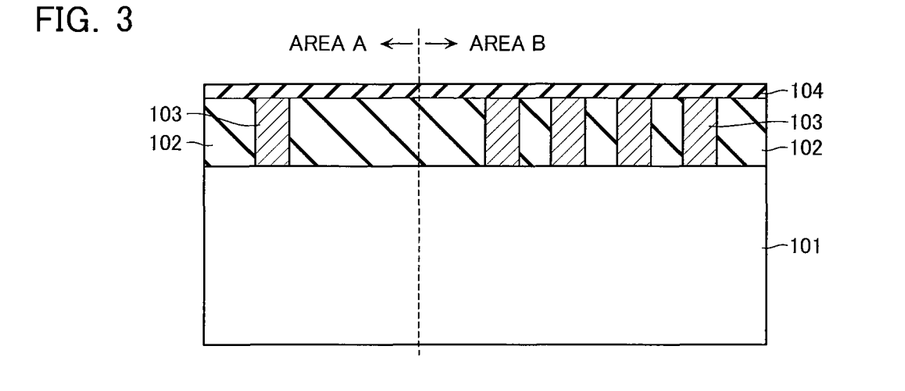
FIG. 3 is a sectional view illustrating a method of manufacturing a semiconductor device according to the first embodiment.

First, as illustrated in FIG. 3, the interlayer insulation film 102 which serves as insulation separation layers for the semiconductor element such as the DMOS transistor is deposited on the entire surface of the semiconductor substrate 101. Next, the contacts 103 connected to the semiconductor element such as the DMOS transistor are formed at certain positions. Then, the stopper film 104 which serves as an etching stopper of the first wiring layer is deposited on the entire surface on the interlayer insulation films 102 including the contacts 103. For the stopper film 104, it is possible to use a silicon nitride film (SiN film) which indicates a high etching selectivity with respect to the silicone oxide film ($SiO_2$ film) which is a material of an interlayer insulation film to be layered thereon.

Figure 4:
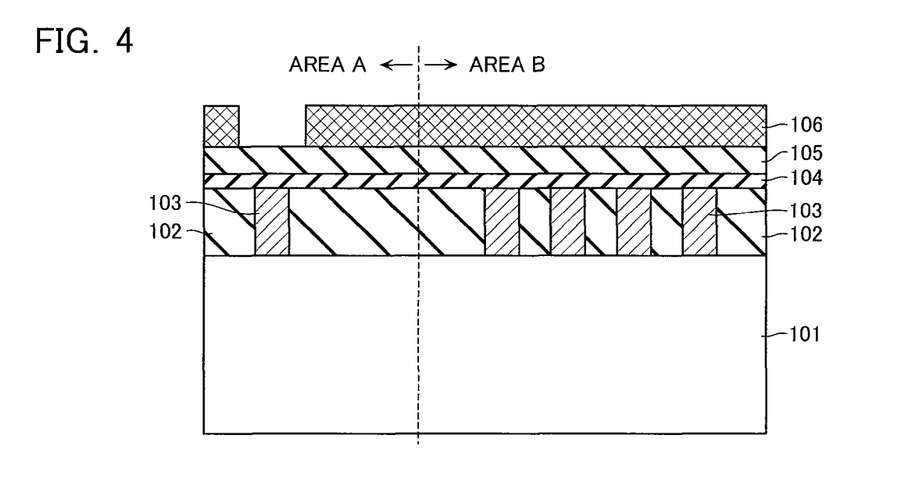
FIG. 4 is a sectional view illustrating the method of manufacturing a semiconductor device according to the first embodiment.

Next, as illustrated in FIG. 4, the interlayer insulation film 105 is deposited on the stopper film 104. The interlayer insulation film 105 functions to insulate the metal layer formed in the first wiring layer from the surrounding. Next, photoresists 106 are patterned by a photolithography method to perform a patterning process for the first wiring layer in the area A.

Figure 5:
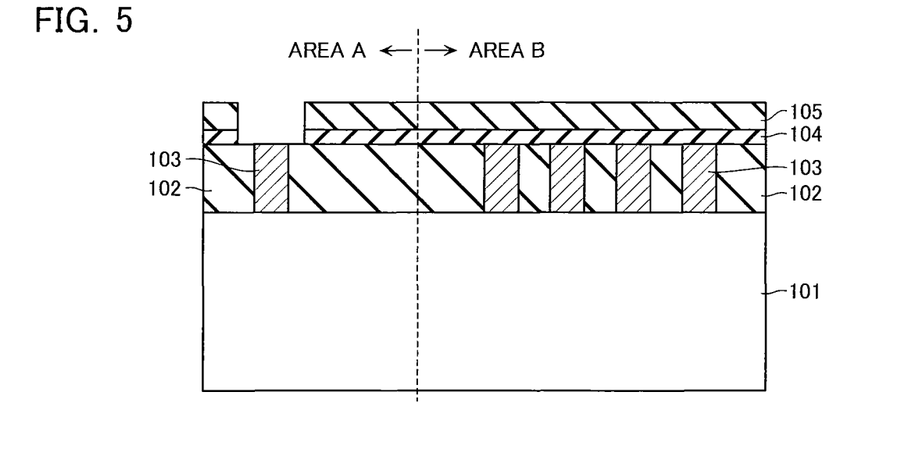
FIG. 5 is a sectional view illustrating the method of manufacturing a semiconductor device according to the first embodiment.

Next, as illustrated in FIG. 5, using the photoresists 106 as masks, the interlayer insulation film 105 and the stopper film 104 are processed by anisotropic dry etching. Through this process, a wiring trench in which a metal layer is formed later is formed. After the interlayer insulation film 105 and the stopper film 104 are processed, the photoresists 106 are removed.

Figure 6:
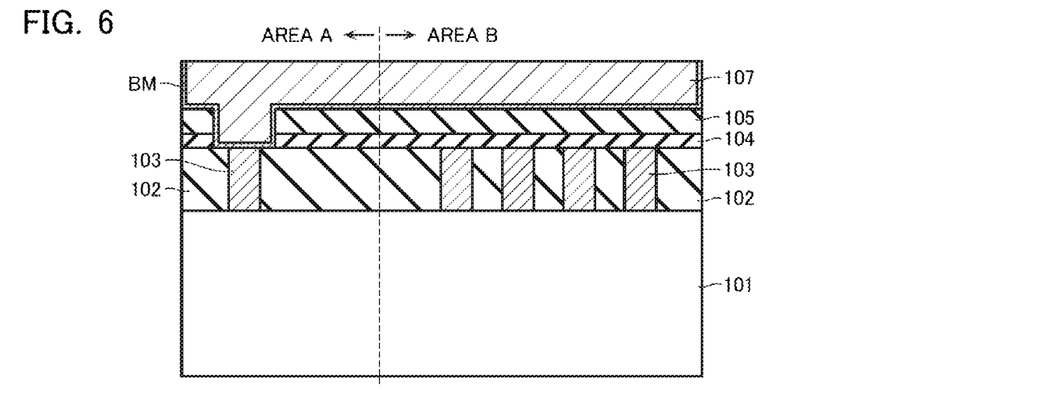
FIG. 6 is a sectional view illustrating the method of manufacturing a semiconductor device according to the first embodiment.

Next, as illustrated in FIG. 6, the metal layer 107 is deposited on the entire surface of the interlayer insulation film 105 and inside the wiring trench formed in the area A. The metal layer 107 can be formed by sequentially depositing, in vacuum atmosphere, a tantalum film which functions as barrier metal BM and a copper film which serves as a seed layer for plating, and then depositing thick copper by electrolytic plating.

Figure 7:
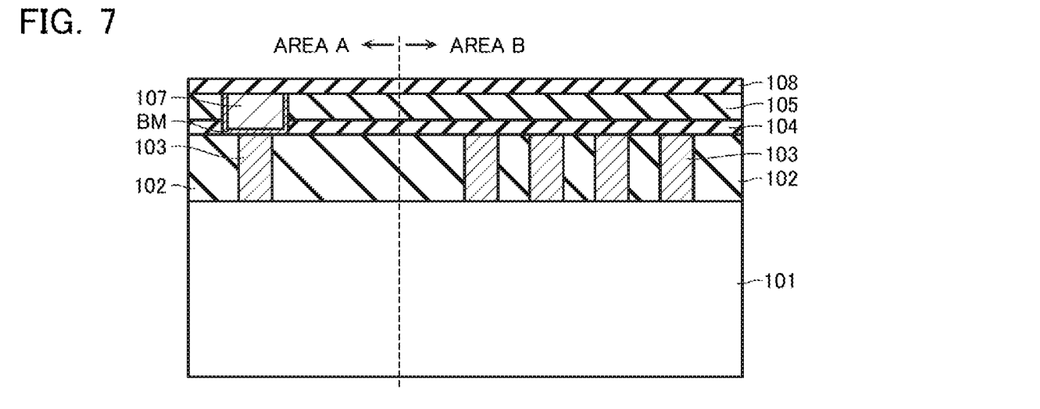
FIG. 7 is a sectional view illustrating the method of manufacturing a semiconductor device according to the first embodiment.

Next, as illustrated in FIG. 7, the unnecessary metal layer 107 is removed by a CMP (Chemical Mechanical Polishing) method. Then, the stopper film 108 is deposited on the entire surface of the interlayer insulation film 105 as well as on the metal layer 107. Meanwhile, similar to the stopper film 104, a silicon nitride film (SiN film) can be used for the stopper film 108. The stopper film 108 may be substituted by a CoWP film which is selectively deposited on the copper using a non-electrolytic plating, and functions as diffusion prevention film. In this case, the stopper film 108 can be omitted.

Figure 8:
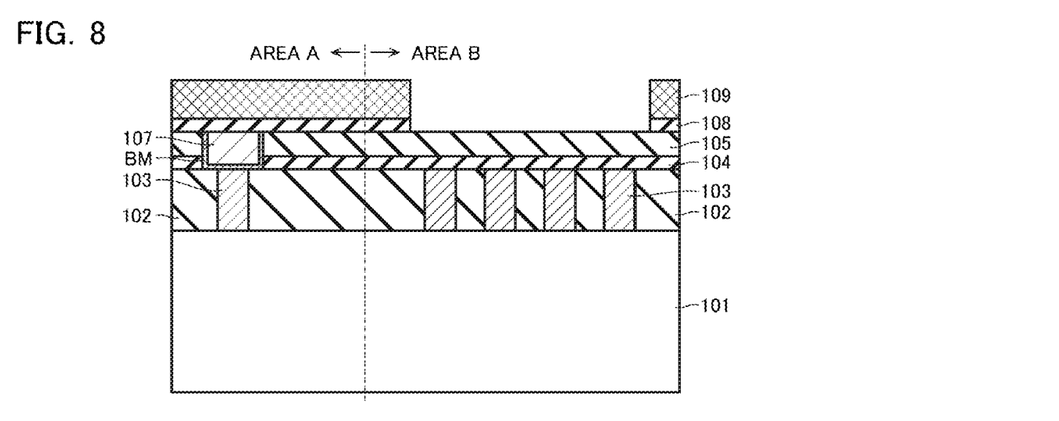
FIG. 8 is a sectional view illustrating the method of manufacturing a semiconductor device according to the first embodiment.

Next, as illustrated in FIG. 8, photoresists 109 are patterned by a photolithography method to make an opening in the stopper film 108 in the area B. Then, using the photoresists 109 as masks, the opening is formed in the stopper film 108.

Figure 9:
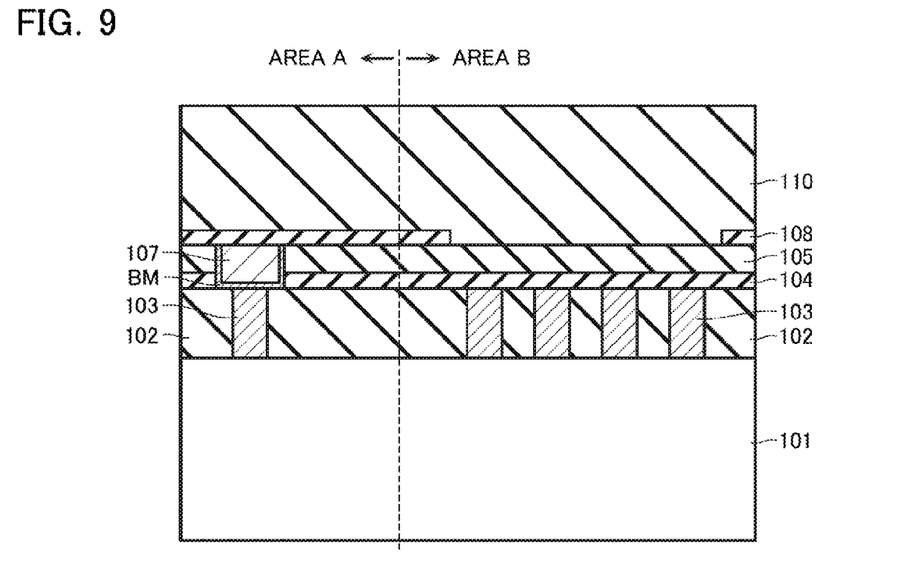
FIG. 9 is a sectional view illustrating the method of manufacturing a semiconductor device according to the first embodiment.

Next, as illustrated in FIG. 9, the photoresists 109 are removed, and then the interlayer insulation film 110 is deposited on the entire surface of the stopper film 108. For the interlayer insulation film 110, a silicon oxide film ($SiO_2$ film) can be used.

Figure 10:
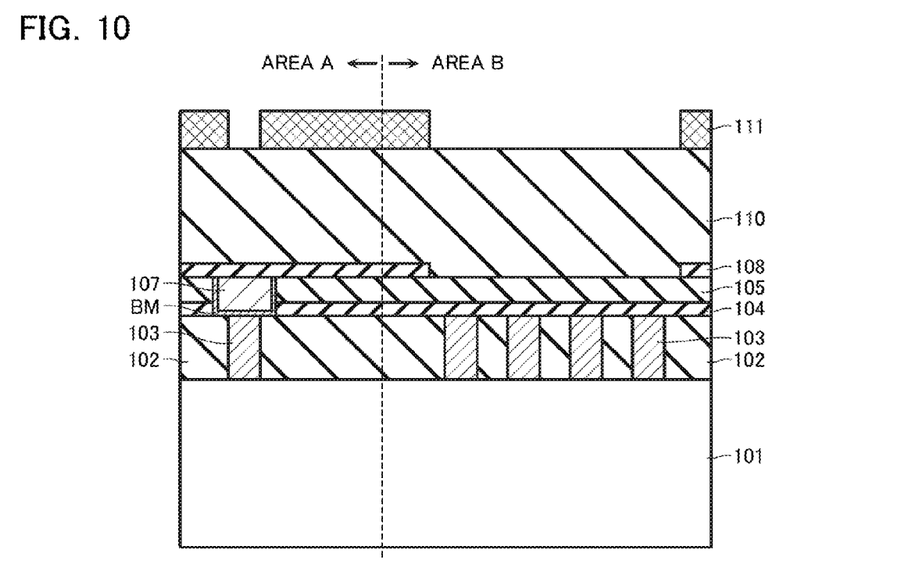
FIG. 10 is a sectional view illustrating the method of manufacturing a semiconductor device according to the first embodiment.

Next, as illustrated in FIG. 10, photoresists 111 are deposited and patterned on the interlayer insulation film 110. The pattern of the photoresists 111 allows formation of columnar contacts which has the width W2 to connect the metal layer in the area A. In the area B, the pattern of the photoresists 111 also allows formation of a trench in which a metal layer having the width W3 is buried after the following process.

Figure 11:
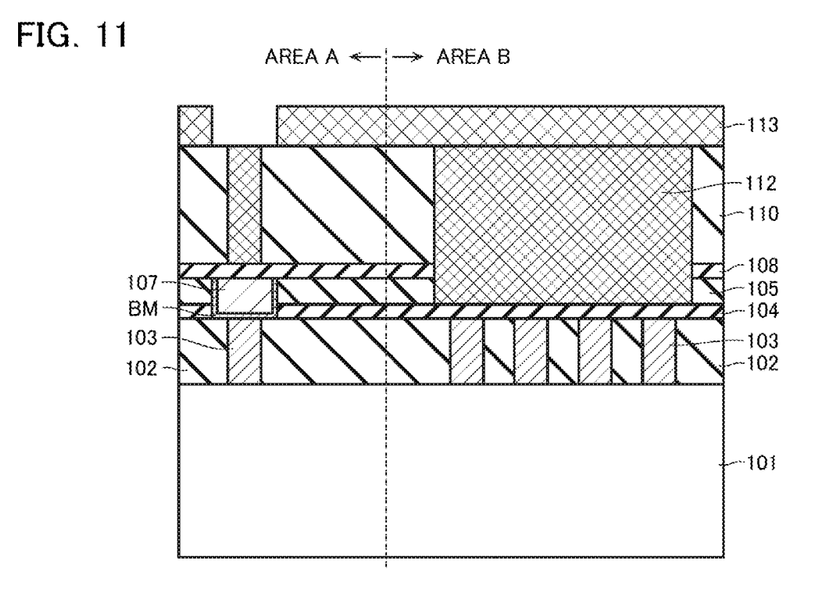
FIG. 11 is a sectional view illustrating the method of manufacturing a semiconductor device according to the first embodiment.

Next, as illustrated in FIG. 11, using the photoresists 111 as masks, the interlayer insulation film 110 and the interlayer insulation film 105 are processed by anisotropic dry etching. Through this process, etching in the area A is stopped by the stopper film 108, and a wiring trench in which a contact is formed later is formed. Further, etching in the area B is stopped by the stopper film 104, and a wiring trench in which a metal layer is formed later is formed. Then, the photoresists 111 are removed. In the wiring trenches in the areas A and B, burying resists 112 are respectively buried. Next, to form a wiring trench required to form the second wiring layer having the wiring width W1 in the area A, photoresists 113 are patterned by the photolithography method.

Figure 12:
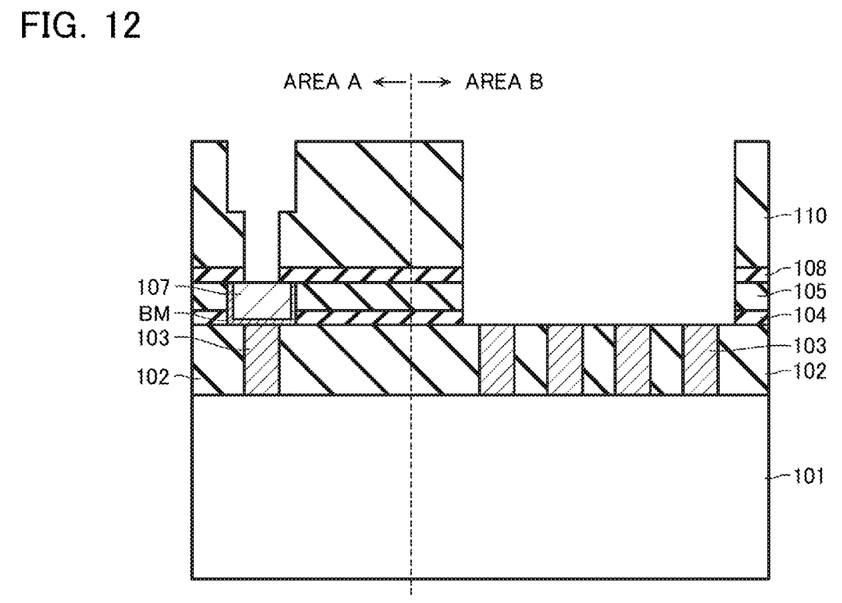
FIG. 12 is a sectional view illustrating the method of manufacturing a semiconductor device according to the first embodiment.

Next, as illustrated in FIG. 12, using the patterned photoresists 113 as masks, a wiring trench in which the second wiring layer is formed is formed in the area A. The photoresists 113 and the burying resists 112 are removed. Then, etching is executed on the entire surface, and the stopper film 108 in the area A and the stopper film 104 in the area B are removed. As a result, openings are made in the stopper films 108 and 104 below the wiring pattern in the areas A and B.

Figure 13:
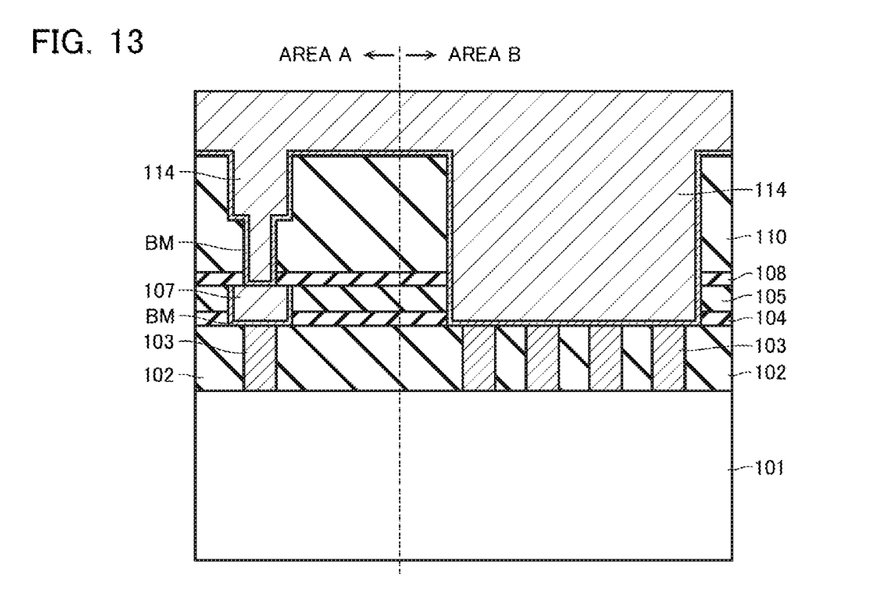
FIG. 13 is a sectional view illustrating the method of manufacturing a semiconductor device according to the first embodiment.

Next, as illustrated in FIG. 13, the metal layer 114 is formed on the entire surface of the interlayer insulation film 110 and inside the wiring trench to bury opening portions in which the contact member in the area A and metal wiring portions in the areas A and B are formed. The metal layer 114 can be formed by sequentially depositing, in vacuum atmosphere, a tantalum film which functions as barrier metal BM and a copper film which serves as a seed layer for plating, and then depositing thick copper by electrolytic plating. The film thickness of the wiring formed in the area B is thicker than the film thickness of the wiring formed in the area A. Meanwhile, the width W3 of the wiring trench in the area B is wider than the width W1 of the wiring trench in the area A. Therefore, it is possible to well-buried and deposit thick copper to lower portions of the wiring trenches and form metal wirings.

Figure 14:
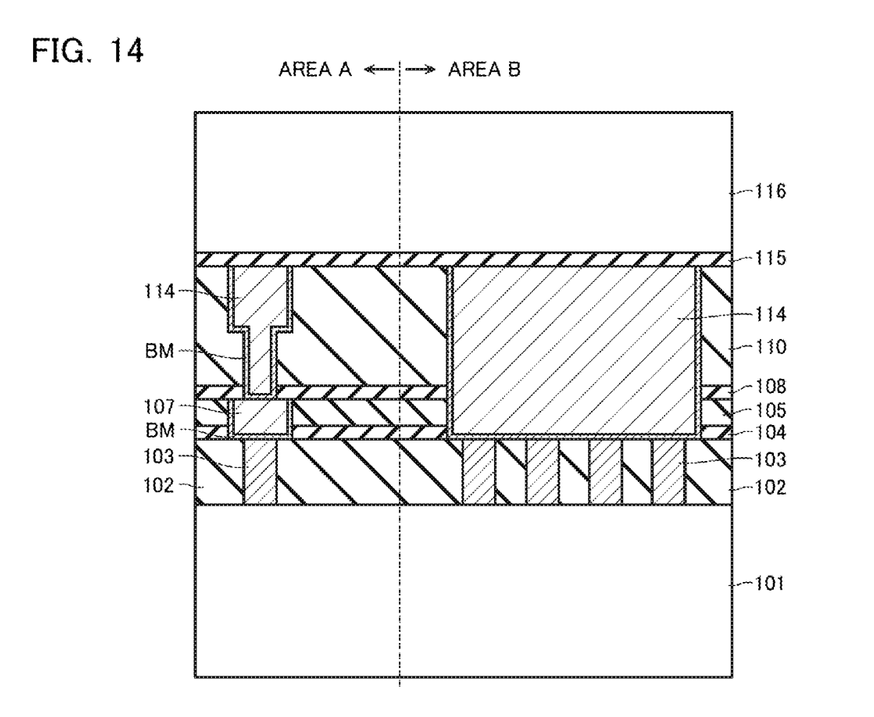
FIG. 14 is a sectional view illustrating the method of manufacturing a semiconductor device according to the first embodiment.

Next, as illustrated in FIG. 14, the unnecessary metal film 114 is removed by a CMP method. By this method, it is possible to form the semiconductor device according to the first embodiment illustrated in FIG. 2. Then, a stopper film 115 and an interlayer insulation film 116 may be sequentially deposited on the entire surface on the interlayer insulation film 110 including the metal layer 114 if necessary.

Second Embodiment

Next, a semiconductor device according to the second embodiment will be described with reference to FIG. 15. The entire configuration of the semiconductor device according to the present embodiment is the same as that of the first embodiment, and will not be described in detail. Further, a semiconductor substrate 201, an interlayer insulation film 202, contacts 203, and an interlayer insulation film 205 according to the second embodiment correspond to the semiconductor substrate 101, interlayer insulation film 102, contacts 103 and interlayer insulation film 105 according to the first embodiment, respectively and employ the same configuration.

Further, metal layers 214a and 214b, interlayer insulation film 210, stopper film 215 and so on of the semiconductor device according to the present embodiment in the area A employ the same configurations as the metal layers 114a and 114b, interlayer insulation film 110, stopper film 115 and so on according to the first embodiment in the area A.

Figure 15:
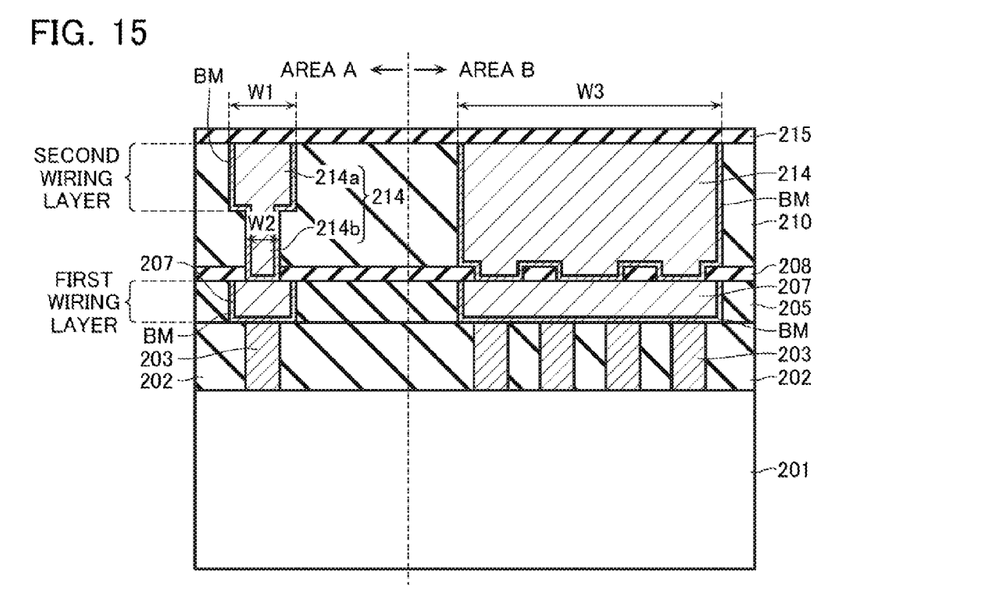
FIG. 15 is a sectional view illustrating a configuration of a semiconductor device according to a second embodiment.

The semiconductor device according to the present embodiment illustrated in FIG. 15 differs from that of the first embodiment in that the wirings connected to the contacts 203 in the area B is formed with a first metal member 207 provided in the first wiring layer and a second metal member 214 having the film thickness from the second wiring layer to the upper surface of the first wiring layer.

Further, while the semiconductor device according to the first embodiment has the stopper film 104 and the stopper film 108, the semiconductor device according to the present embodiment omits the stopper film provided in the first wiring layer, and only a stopper film 208 is formed on the first wiring layer. In the semiconductor device according to the present embodiment, the second metal member 214 in the area B penetrates the stopper film 208 and connects to the first metal member 207.

[Advantage]

In the semiconductor device according to the present embodiment, the wiring formed in the area B is formed with the first metal member 207 and the second metal member 214 having the film thickness over the two wiring layers. In the semiconductor device according to the present embodiment illustrated in FIG. 15, the first metal members 207 and the second metal members 214 do not include the interlayer insulation film and the sectional area of the wiring increases, so that it is possible to reduce the wiring resistance.

Next, the method of manufacturing a semiconductor device according to the present embodiment will be described with reference to FIGS. 16 to 19. FIGS. 16 to 19 are sectional views illustrating the method of manufacturing a semiconductor device according to the second embodiment. In the method of manufacturing a semiconductor device, a forming process of a semiconductor device such as a DMOS transistor is performed by a common method of manufacturing a semiconductor device. Hereinafter, a method of manufacturing wiring layers formed above the contacts 203 will be described.

Figure 16:
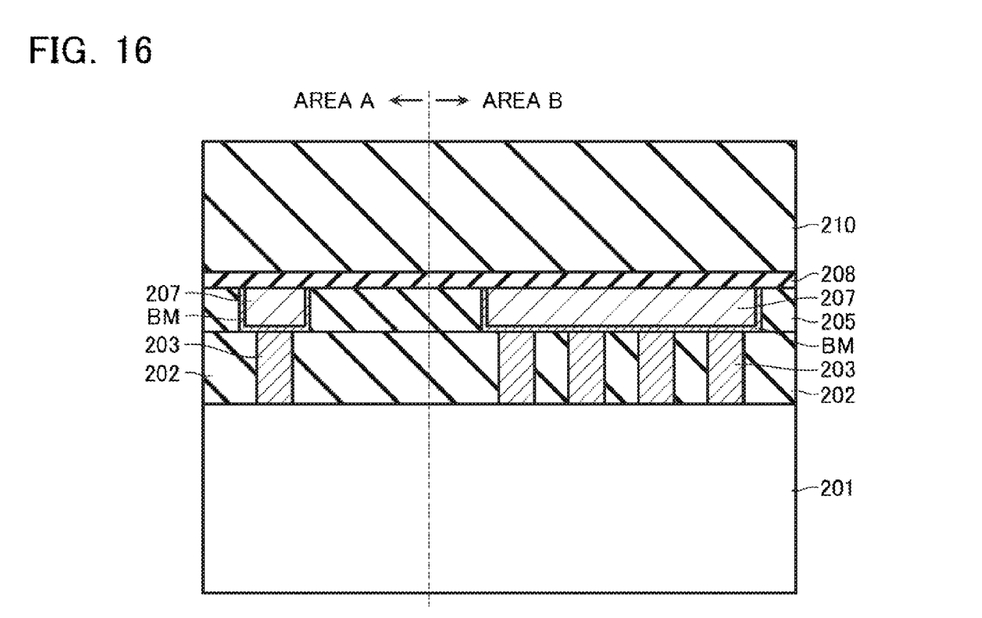
FIG. 16 is a sectional view illustrating a method of manufacturing a semiconductor device according to the second embodiment.

The process of forming the interlayer insulation film 202, contacts 203, interlayer insulation film 205, metal layer 207, stopper film 208 and interlayer insulation film 210 according to the second embodiment is substantially the same as the process according to the first embodiment of forming the interlayer insulation film 102, contacts 103, interlayer insulation film 105, metal layer 107, stopper film 108 and interlayer insulation film 110 illustrated in FIGS. 3 to 9. Note that, as illustrated in FIG. 16, the method of manufacturing a semiconductor device according to the present embodiment differs from the first embodiment in removing the stopper film 104. Further, the method of manufacturing a semiconductor device according to the present embodiment differs from the first embodiment in forming the metal layer 207 (first metal member) also in the first wiring layer in the area B.

Figure 17:
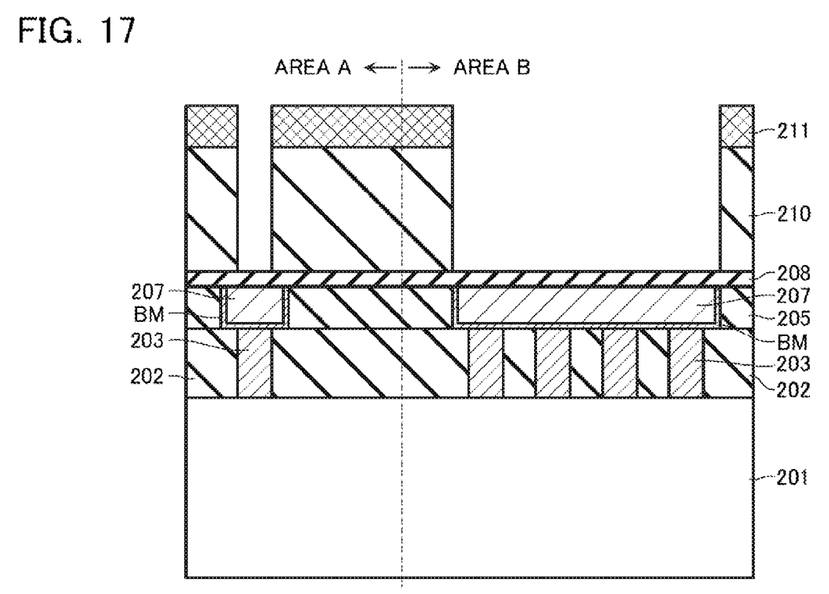
FIG. 17 is a sectional view illustrating the method of manufacturing a semiconductor device according to the second embodiment.

Next, as illustrated in FIG. 17, photoresists 211 are deposited and patterned on the interlayer insulation film 210. The pattern of the photoresists 211 allows formation of columnar contacts which has the width W2 to connect the metal layer in the area A. In the area B, the pattern of the photoresists 211 also allows formation of a trench in which a metal layer having the width W3 is buried after the following process. Then, using the photoresists 211 as masks, the interlayer insulation film 210 is processed by anisotropic dry etching. In this case, etching is stopped by the stopper film 208. Through this process, wiring trenches in which contacts or metal layers are formed later are formed.

Figure 18:
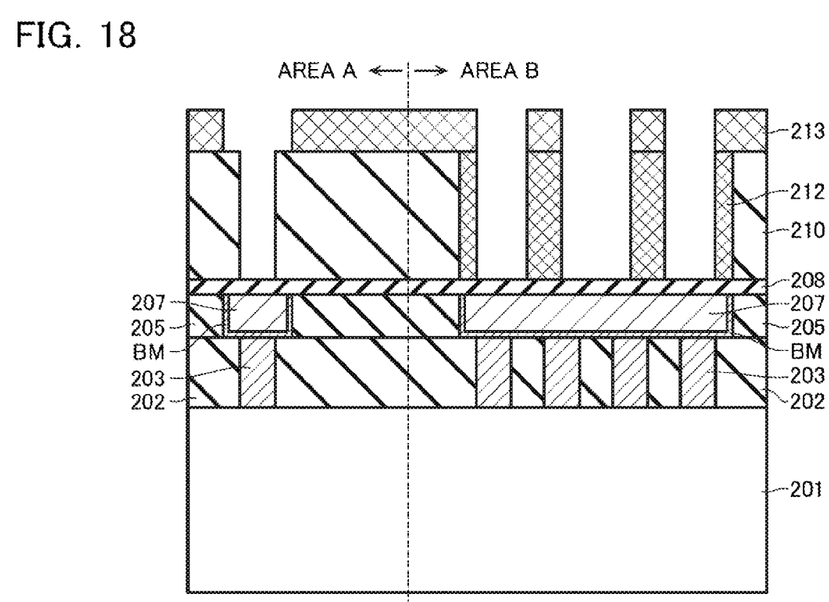
FIG. 18 is a sectional view illustrating the method of manufacturing a semiconductor device according to the second embodiment.

Next, as illustrated in FIG. 18, the photoresists 211 are removed. Burying resists 212 are buried respectively in the wiring trenches in the areas A and B. Next, photoresists 213 are patterned by the photolithography method and, using the photoresists 213 as masks, the burying resists 212 are removed from the wiring trenches in the areas A and B.

Figure 19:
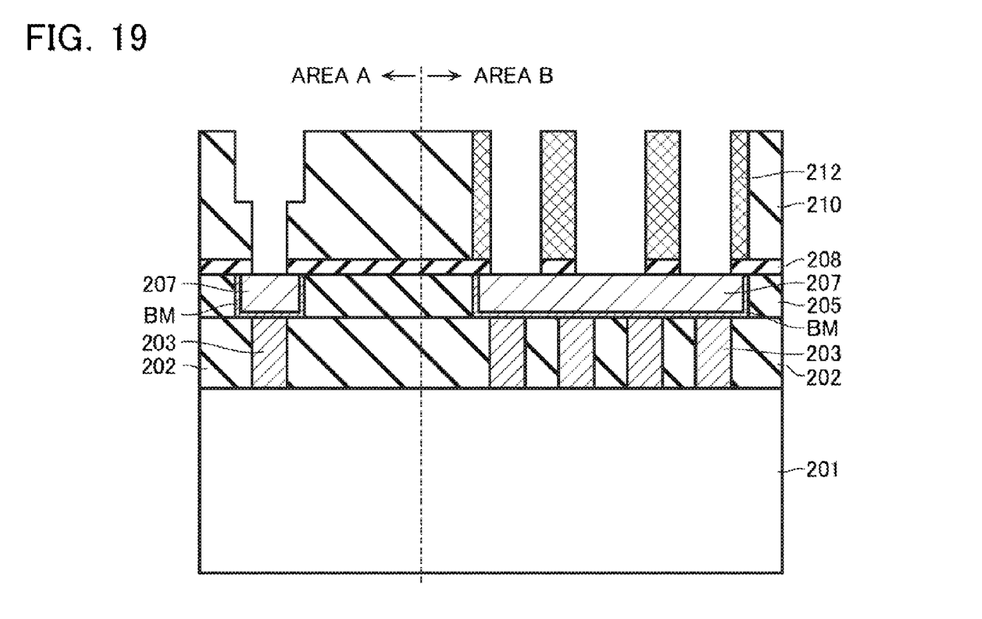
FIG. 19 is a sectional view illustrating the method of manufacturing a semiconductor device according to the second embodiment.

Next, as illustrated in FIG. 19, the photoresists 213 are removed, then etching is executed on the entire surface and the stopper film 208 is removed in the areas A and B. Through this process, openings are made in the stopper film 208 below the wiring pattern in the areas A and B. Instead, all of the burying resists 212 in the area B may be removed and the stopper film 208 on the metal layer 207 (first metal member) in the area B may be entirely removed.

Then, the burying resists 212 are removed. The metal layer 214 is formed on the entire surface of the interlayer insulation films 210 and inside the wiring trenches to bury opening portions in which contact member in the area A and metal wiring members in the areas A and B are formed. The metal layer 214 can be formed by sequentially depositing, in vacuum atmosphere, a tantalum film which functions as barrier metal BM and a copper film which serves as a seed layer for plating, and then depositing thick copper by electrolytic plating. Next, the unnecessary metal film 214 is removed by a CMP method. Then, a stopper film 215 may be deposited on the entire surface on the interlayer insulation film 210 including the metal layer 214 if necessary. Through this process, it is possible to form the semiconductor device according to the second embodiment illustrated in FIG. 15.

Another Example of Second Embodiment

Figure 20:
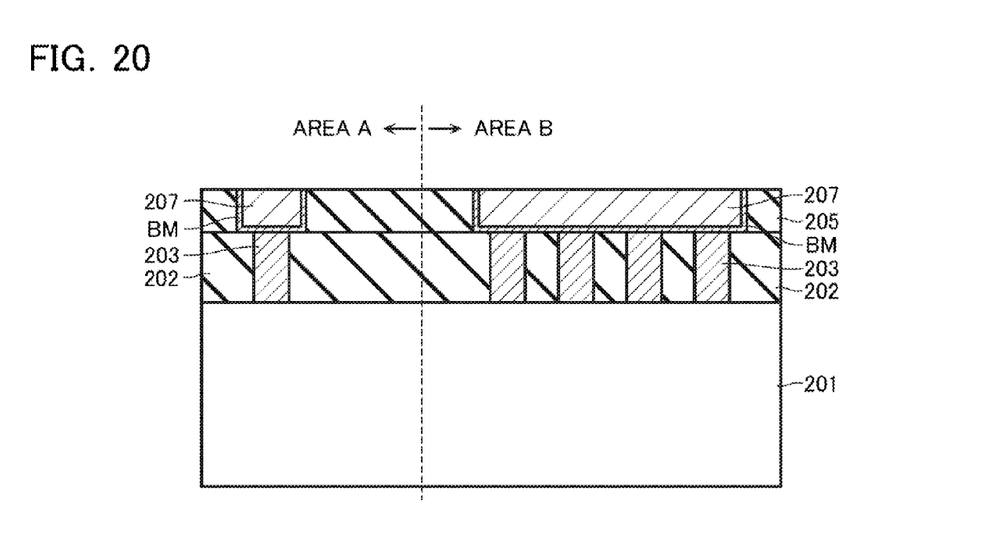
FIG. 20 is a sectional view illustrating a method of manufacturing a semiconductor device according to another example of the second embodiment.

Next, another example of the method of manufacturing a semiconductor device according to the second embodiment will be described with reference to FIGS. 20 to 22. In the second embodiment illustrated in FIG. 15, the stopper film 208 is provided on the entire surface of the first wiring layer. This stopper film 208 may not necessarily be provided on the entire surface and only needs to be provided on the metal layers 207.

The process of forming the interlayer insulation film 202, contacts 203, interlayer insulation film 205 and metal layer 207 according to the present example is substantially the same as process according to the first embodiment of forming the interlayer insulation film 102, contacts 103, interlayer insulation film 105 and metal layer 107 illustrated in FIGS. 3 to 6. Note that, as illustrated in FIG. 20, the method of manufacturing a semiconductor device according to the present example differs from the first embodiment in omitting the stopper films 104. Further, the method of manufacturing a semiconductor device according to the present example differs from the first embodiment in forming the metal layer 207 (first metal member) also in the first wiring layer in the area B.

Figure 21:
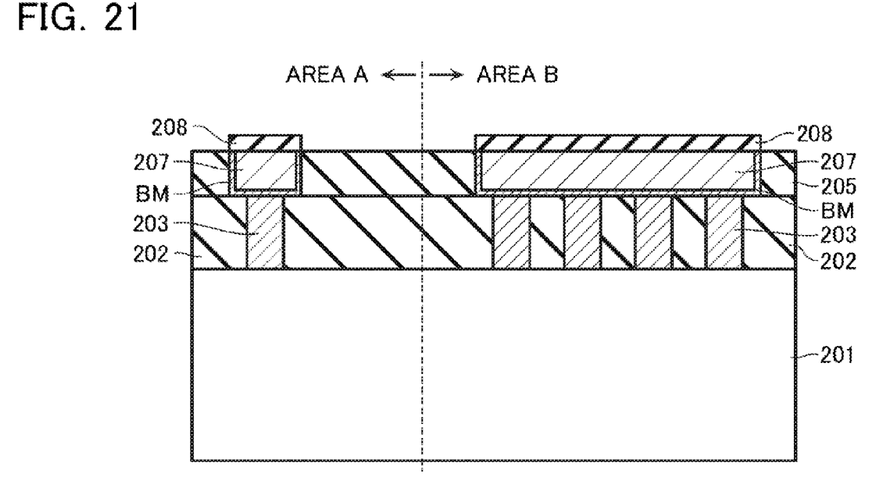
FIG. 21 is a sectional view illustrating a method of manufacturing a semiconductor device according to another example of the second embodiment.

Next, as illustrated in FIG. 21, the unnecessary metal layer 207 is removed by a CMP (Chemical Mechanical Polishing) method. Then, the stopper film 208 is deposited on the entire surface of the interlayer insulation film 205 as well as on the metal layers 207. A silicon nitride film (SiN film) can be used for the stopper films 208. Next, with the manufacturing method according to the present example, resists (not illustrated) are deposited and patterned on the upper surfaces of the stopper films 208. Then, using the resists as masks, the stopper films 208 other than on the upper surfaces of the metal layers 207 are removed.

Figure 22:
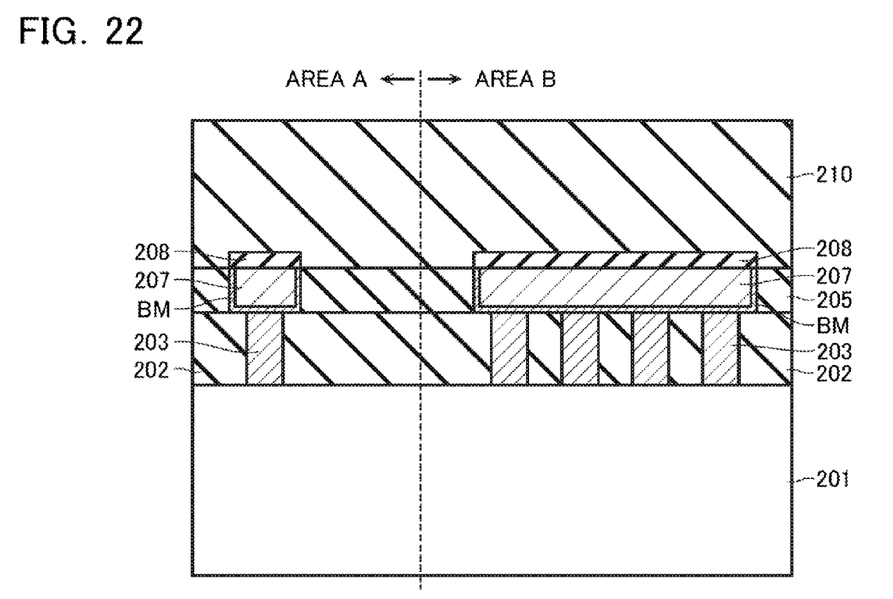
FIG. 22 is a sectional view illustrating a method of manufacturing a semiconductor device according to another example of the second embodiment.

Next, as illustrated in FIG. 22, the resists are removed, and then the interlayer insulation film 210 is deposited on the entire surface of the stopper films 208. For the interlayer insulation film 210, a silicon oxide film ($SiO_2$ film) can be used. Then, the semiconductor device according to the present example can be manufactured by the same process as the manufacturing method according to the second embodiment illustrated in FIGS. 16 to 19.

[Others]

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a semiconductor substrate; and
a first area and a second area which are respectively provided on the semiconductor substrate,
the first area including:
a first metal wiring in a first wiring layer above the semiconductor substrate and having a first width;
a second metal wiring in a second wiring layer above the first wiring layer and having the first width; and
a first contact between the first wiring layer and the second wiring layer, connecting the first metal wiring and the second metal wiring, and having a second width equal to or less than the first width, and
the second area including:
a third metal wiring having a metal film and a barrier metal film, the third metal wiring extending in a thickness direction from a bottom surface of the first wiring layer to an upper surface of the second wiring layer, and having a third width along the entire thickness thereof, the third width being wider than the first width, the barrier metal film being on the bottom surface of the first wiring layer and a side surface of the metal film, the metal film extending from an upper surface of the barrier metal film on the bottom surface of the first wiring layer to the upper surface of the second wiring layer.

2. The semiconductor device according to claim 1, wherein the first area includes:
a first element formed in the first area on the semiconductor substrate; and
a second contact connected to the first element and the first metal wiring, and the second area includes:
a second element formed in the second area on the semiconductor substrate; and
a third contact connected to the second element and the third metal wiring.

3. The semiconductor device according to claim 2, wherein the second element includes a DMOS transistor, the DMOS transistor comprising:
a gate electrode formed on the semiconductor substrate via a gate insulation film;
a pair of source and drain diffusion regions provided on both sides of the gate electrode and having a first impurity concentration; and
a drift region having a second impurity concentration lower than the first impurity concentration and provided adjacent to one of the source and drain diffusion regions.

4. The semiconductor device according to claim 1, further comprising a diffusion prevention film formed on the first wiring layer and having a function of preventing diffusion of metal used for the first metal wiring into an interlayer insulation film,
wherein the first contact penetrates the diffusion prevention film to be connected to the first metal wiring.

5. The semiconductor device according to claim 1, wherein the first metal wiring, the second metal wiring and the third metal wiring are made of copper.

6. A method of manufacturing a semiconductor device, comprising:
forming, in a first area provided on a semiconductor substrate, a first metal wiring in a first wiring layer, the first metal wiring having a first width;
forming, in the first area, a second metal wiring in a second wiring layer above the first wiring layer, the second metal wiring having the first width;

forming a first contact between the first wiring layer and the second wiring layer, the first contact connecting the first metal wiring and the second metal wiring and having a second width equal to or less than the first width; and forming, in a second area provided on the semiconductor substrate, a third metal wiring comprising a metal film and a barrier metal film, the third metal wiring extending in a thickness direction from a bottom surface of the first wiring layer to an upper surface of the second wiring layer, the third metal wiring having a third width along the entire thickness thereof, the barrier metal film being on the bottom surface of the first wiring layer and a side surface of the metal film, the metal film extending from an upper surface of the barrier metal film on the bottom surface of the first wiring layer to the upper surface of the second wiring layer.

7. The method of manufacturing a semiconductor device according to claim 6, further comprising:

forming a second contact connected to a first element provided in the first area on the semiconductor substrate; and forming a third contact connected to a second element provided in the second area on the semiconductor substrate, wherein the first metal wiring is connected to the second contact, and the third metal wiring is connected to the third contact.

8. The method of manufacturing a semiconductor device according to claim 6, wherein the third width is wider than the first width.

9. The method of manufacturing a semiconductor device according to claim 6, further comprising:

forming on the first wiring layer a diffusion prevention film having a function of preventing diffusion of metal used for the first metal wiring into an interlayer insulation film; and forming the first contact to penetrate the diffusion prevention film and connect to the first metal wiring.

10. The method of manufacturing a semiconductor device according to claim 6, wherein the first metal wiring, the first contact, the second metal wiring and the third metal wiring are made of copper.

11. The method of manufacturing a semiconductor device according to claim 6, wherein the third metal wiring is formed using a damascene method.

12. The method of manufacturing a semiconductor device according to claim 11, wherein the first contact, the second metal wiring, and the third metal wiring are formed simultaneously using the damascene method.

13. The semiconductor device according to claim 1, wherein the barrier metal film comprises tantalum.

14. The method of manufacturing a semiconductor device according to claim 6, wherein the barrier metal film comprises tantalum.

* * * * *